(12) United States Patent  
Kwon et al.

(10) Patent No.: US 8,559,227 B2  
(45) Date of Patent: Oct. 15, 2013

(54) NONVOLATILE MEMORY DEVICE

(75) Inventors: Lee-Hyun Kwon, Gyeonggi-do (KR); In-Sou Wang, Gyeonggi-do (KR); Myung-Jin Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 26 days.

(21) Appl. No.: 13/178,175

(22) Filed: Jul. 7, 2011

(65) Prior Publication Data

US 2012/0008398 A1    Jan. 12, 2012

(30) Foreign Application Priority Data

Jul. 7, 2010    (KR) ........................ 10-2010-0065272

(51) Int. Cl.
*G11C 16/06*    (2006.01)

(52) U.S. Cl.
USPC ............. 365/185.18; 365/185.27; 365/185.13

(58) Field of Classification Search
USPC ............. 365/185.03, 185.18, 185.23, 185.27, 365/189.09, 185.13, 185.22
See application file for complete search history.

(56) References Cited

U.S. PATENT DOCUMENTS

| | | | |
|---|---|---|---|
| 6,246,280 B1* | 6/2001 | Morishita | 327/535 |
| 2007/0147141 A1* | 6/2007 | Shibata | 365/189.09 |
| 2008/0112212 A1* | 5/2008 | Wang et al. | 365/154 |
| 2008/0181001 A1* | 7/2008 | Shalvi | 365/185.03 |
| 2008/0183951 A1* | 7/2008 | Lee et al. | 711/103 |
| 2008/0259690 A1* | 10/2008 | Chae et al. | 365/185.18 |
| 2010/0188139 A1* | 7/2010 | Lee | 327/536 |

FOREIGN PATENT DOCUMENTS

| | | |
|---|---|---|
| KR | 1020030056185 | 7/2003 |
| KR | 1020040015682 | 2/2004 |
| KR | 1020070047335 | 5/2007 |
| KR | 1020070115257 | 12/2007 |

OTHER PUBLICATIONS

Notice of Allowance issued by the Korean Intellectual Property Office on Feb. 13, 2012.

* cited by examiner

*Primary Examiner* — Douglas King
(74) *Attorney, Agent, or Firm* — IP & T Group LLP

(57) ABSTRACT

A nonvolatile memory device includes a plurality of global word lines, a plurality of transistors configured to transfer voltages of the global word lines to a plurality of local word lines inside a cell block, and a voltage control unit configured to supply a first negative voltage to a global word line of the plurality of global word lines and configured to charge a bulk region of the plurality of transistors with a second negative voltage.

9 Claims, 5 Drawing Sheets

NONVOLATILE MEMORY DEVICE

CROSS-REFERENCE TO RELATED APPLICATIONS

The present application claims priority of Korean Patent Application No. 10-2010-0065272, filed on Jul. 7, 2010, which is incorporated herein by reference in its entirety.

BACKGROUND

1. Field

Exemplary embodiments of the present invention relate to a nonvolatile memory device.

2. Description of the Related Art

Nonvolatile memory devices maintain data stored therein even when power supply is cut off. As an example of the nonvolatile memory devices, a floating-gate-type nonvolatile memory device may be driven by using a floating gate positioned over a channel region of a substrate and insulated from the channel region. Here, as the amount of electric charges maintained in a conductive band of the floating gate is adjusted, a threshold voltage of a floating-gate-type nonvolatile memory is shifted. When a program operation is performed on a memory cell, electrons are stored in a conductive band of a floating gate by Fouler-Nordheim (F-N) tunneling. In this case, the threshold voltage of the memory cell is raised by the electric charges stored in the conductive band of the floating gate. Here, the characteristics of memory cells inside a nonvolatile memory device are different from each other, and the memory cells have a constant threshold voltage distribution width. Hereafter, a method for storing data in memory cells of a flash memory, for example, will be described.

A nonvolatile memory device includes a memory cell array to store data. The memory cell array includes a plurality of memory blocks. Each of the memory blocks includes a plurality of pages. Each of the pages includes a plurality of memory cells. The memory cells are divided into on cells and off cells, depending on threshold voltage distributions. The on cells are erased cells, and the off cells are programmed cells. The nonvolatile memory device performs an erase operation by the memory block and performs a read or write operation by the page.

Meanwhile, the nonvolatile memory device may store one bit data in one memory cell, or store two or more bits in one memory cell. In general, a memory cell to store one bit data is referred to as a single level cell (SLC), and a memory cell to store two or more bits is referred to as a multi-level cell (MLC). The SLC has an erase state or a program state depending on a threshold voltage, and the MLC has an erase state and a plurality of program states depending on threshold voltages.

A nonvolatile memory device having MLCs may reduce the gap between the threshold voltage distributions of the program states to secure a margin between the respective program states. In general, the nonvolatile memory device having MLCs stores 2-bit data or 3-bit data in each memory cell thereof. Here, the voltage level of a voltage in the erase state and the voltage levels of threshold voltages in some program states may be set to negative voltages. In this case, the performance and reliability of the nonvolatile memory device having MLCs may be improved.

FIG. 1 is a diagram comparatively showing a conventional threshold voltage distribution 110 and a threshold voltage distribution 120 when some of threshold voltages of the program states are set to a negative voltage. Hereafter, when some of the threshold voltages of the program states are set to a negative voltage, the threshold voltage distribution 120 is referred to as 'negative distribution'. The voltage distributions of FIG. 1 show a threshold voltage distribution of program states of a nonvolatile memory device having MLCs to store 2-bit data.

An MLC to store 2-bit data has an erase state and three program states. As described above, an adequate margin is to be obtained between the respective program states, in order to improve the performance and reliability of a nonvolatile memory device having MLCs. At this time, the gap between threshold voltage distributions of the respective program states may be reduced to secure a margin. Alternatively, as shown in the negative distribution 120 of FIG. 1, the threshold voltage distribution of some program states among the three program states may be set to a negative voltage to increase a margin.

In the case of the existing threshold voltage distribution 110 shown in FIG. 1, only the threshold voltage distribution of an erase state 111 is set to a negative voltage, and the other threshold voltage distributions of first to third program states 112 to 114 are each set to a positive voltage. In the case of the negative distribution 120, the threshold voltage distributions of an erase state 121 and a first program state 122 are set to a negative voltage, and the threshold voltage distributions of second and third program states 123 and 124 are each set to a positive voltage. The threshold voltage distribution of a program state has an upper limit. More specifically, it is difficult to program a memory cell such that the threshold voltage thereof is set above a predetermined voltage. Therefore, when the threshold voltage distribution of the first program state 122 is set to a negative voltage as in the negative distribution 120, the second and third program states 123 and 124 may be distributed so that the interval between the two states may have an adequate margin. Such a method may be more usefully utilized in the case of a nonvolatile memory device having MLCs to store 3-bit data.

First to third dotted lines 115 to 117 indicate the levels of a plurality of verification voltages for determining whether or not MLCs are normally programmed in the existing threshold voltage distribution 110. Fourth to sixth dotted lines 125 to 127 indicate the levels of a plurality of verification voltages for determining whether or not MLCs are normally programmed in the negative distribution 120. As shown in FIG. 1, the levels of the verification voltages are to be positioned between the respective threshold voltage distributions of different program states. Here, based on whether a memory cell is turned on or off when a verification voltage is applied to a floating gate of the memory cell, it is determined whether the memory cell has been normally programmed or not.

As such, when the negative distribution 120 is used, a verification voltage is set to, for example, a negative voltage 125 in order to verify whether an MLC having the first program state 122 has been normally programmed or not.

SUMMARY

An embodiment of the present invention is directed to a nonvolatile memory device capable of reducing a time for performing a program and verification operation using a negative voltage.

In accordance with an embodiment of the present invention, a nonvolatile memory device includes: a plurality of global word lines; a plurality of transistors configured to transfer voltages of the global word lines to a plurality of local word lines inside a cell block; and a voltage control unit configured to supply a first negative voltage to a global word line of the plurality of global word lines and configured to charge a bulk region of the plurality of transistors with a second negative voltage.

In accordance with another embodiment of the present invention, a nonvolatile memory device includes: a plurality of global word lines; a plurality of first local word lines corresponding to a plurality of memory cells included in a first cell block; a plurality of second local word lines corresponding to a plurality of memory cells included in a second cell block; a plurality of first transistors configured to be turned on to transfer voltages of the global word lines to the first local word lines when the first cell block is selected among the first and second cell blocks; a plurality of second transistors configured to be turned on to transfer the voltages of the global word lines to the second local word lines when the second cell block is selected among the first and second cell blocks; and a voltage control unit configured to supply a first negative voltage a global word line of the plurality of global word lines and configured to charge a bulk region of the first and second transistors with a second negative voltage.

DETAILED DESCRIPTION

Figure 1:
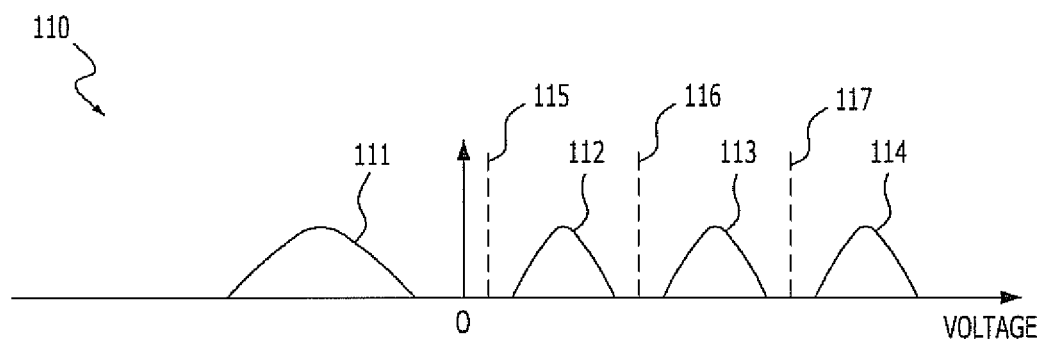
FIG. 1 is a diagram showing a conventional threshold voltage distribution and a negative distribution.
Figure 1:
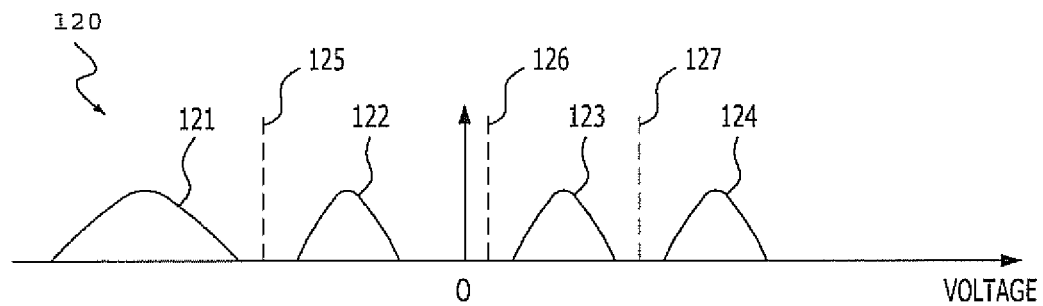

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
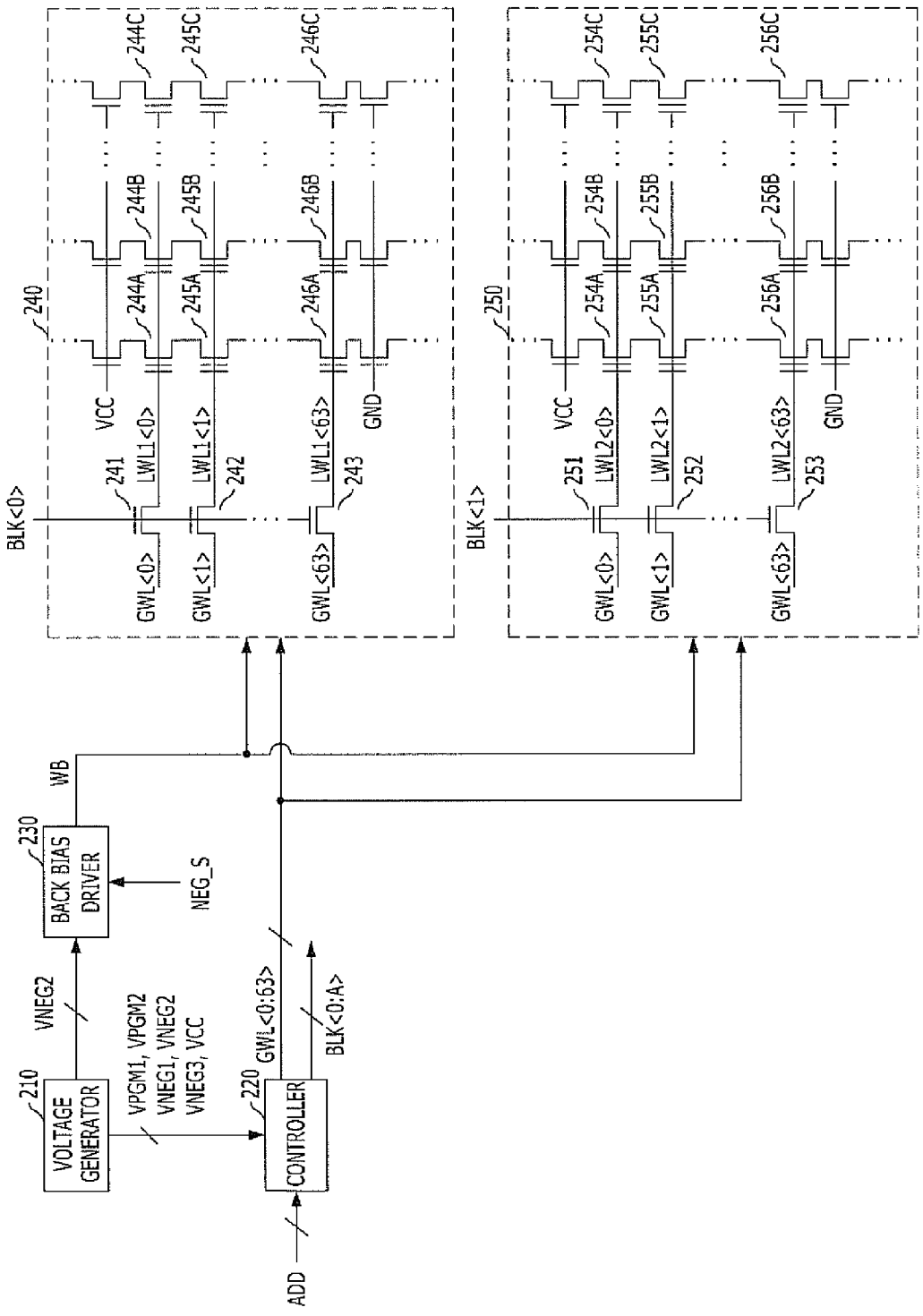
FIG. 2 is a configuration diagram of a nonvolatile memory device in accordance with an embodiment of the present invention.

FIG. 2 is a configuration diagram of a nonvolatile memory device in accordance with an embodiment of the present invention.

Referring to FIG. 2, the nonvolatile memory device includes a voltage generator 210, a plurality of global word lines GWL<0:63>, a controller 220, a plurality of first local word lines LWL<0:63>, a plurality of second local word lines LWL<0:63>, a plurality of first transistors 241 to 243, a plurality of second transistors 251 to 253, and a back bias driver 230. The voltage generator 210 is configured to generate various voltages VPGM1, VPGM2, VNEG1, VNEG2, VNEG3, and VCC for controlling cell blocks 240 and 250. The controller 220 is configured to drive the plurality of global word lines GWL<0:63> to various voltages VPGM1, VPGM2, VNEG1, VNEG2, VNEG3, and VCC in response to an address signal ADD. The plurality of first local word lines LWL1<0:63> correspond to a plurality of memory cells 244A, 244B, 244C, 245A, 245B, 245C, 246A, 246B, and 246C included in the first cell block 240. The plurality of second local word lines LWL2<0:63> correspond to a plurality of memory cells 254A, 254B, 254C, 255A, 255B, 255C, 256A, 256B, and 256C included in the second cell block 250. The plurality of first transistors 241 to 243 are configured to be turned on to transfer voltages of the global word lines GWL<0:63> to the first local word lines LWL1<0:63>, when the first cell block 240 is selected. The plurality of second transistors 251 to 253 are configured to be turned on to transfer voltages of the global word lines GWL<0:63> to the second local word lines LWL2<0:63>, when the second cell block 250 is selected. The back bias driver 230 is configured to apply a back bias voltage to a bulk region of the first and second transistors 241 to 243 and 251 to 253. Here, voltage generator 210, controller 220, and back bias driver 230 operate as a voltage control unit for supplying control voltages to memory cell blocks.

The various voltages VPGM1, VPGM2, VNEG1, VNEG2, VNEG3, and VCC include a plurality of program voltages VPGM1 and VPGM2, a plurality of negative voltages VNEG1, VNEG2, and VNEG3, and a power supply voltage VCC.

The program voltages VPGM1 and VPGM2 refer to a voltage which is applied to a floating gate of a memory cell to change the threshold voltage of the memory cell, during a program operation. Currently, an increment step pulse programming (ISPP) scheme is used as a method for programming a memory cell. The ISPP scheme will be described below with reference to FIG. 3.

In the following descriptions, each of the cell blocks 240 and 250 includes 64 memory cells according to an example. The configuration in which two cell blocks 240 and 250 are provided is an example only, and the number of cell blocks may differ depending on different design needs. Hereafter, the number of cell blocks 240 and 250 is assumed to be two, and the operation of the selected cell block 240 and the operation of the unselected cell block 250 will be described in comparison with each other.

Furthermore, it is assumed that the first cell block 240 is selected and an eleventh memory cell 244A of the first cell block 240 is programmed into a first program state 122. In addition, it is assumed that the second cell block 250 is not selected. Here, an MN memory cell refers to a memory cell positioned at M line and N row of each cell block.

The controller 220 drives the plurality of global word lines GWL<0:63>to the various voltages VPGM1, VPGM2, VNEG1, VNEG2, VNEG3, and VCC generated by the voltage generator 210, in response to the address signal ADD, and generates a plurality of cell block selection signals BLK<0:A>. The cell block selection signals BLK<0:A>correspond to the respective cell blocks 240 and 250. Hereafter, A is assumed to be 1. In the above-described example, the first cell block signal BLK<0> corresponds to the first cell block 240, and the second cell block signal BLK<1> corresponds to the second cell block 250.

The global word line GWL<0> corresponding to the memory cell 244A to be programmed is driven to the first program voltage VPGM1, the second program voltage VPGM2, the first negative voltage VNEG1, or a ground voltage GND by the controller 220, in response to the address signal ADD. The address signal ADD decides the program voltage that the word line GWL<0> is to be driven to.

The first negative voltage VNEG1 is a verification voltage for verifying whether the eleventh memory cell 244A of the first cell block 240 has been programmed into the first program state 122 or not. The other ones of the global word lines GWL<1:63> receive a constant turn-on voltage to turn on memory cells. In a NAND nonvolatile memory device, memory cells other than a memory cell to be programmed are turned on.

In the above-described example, since the eleventh memory cell 244A is programmed, a voltage for the program and verification operation is applied to the first global word line GWL<0>, and voltages for turning on memory cells are applied to the other global word lines GWL<1:63>.

The plurality of first local word lines LWL1<0:63> correspond to the plurality of memory cells 244A, 244B, 244C, 245A, 245B, 245C, 246A, 246B, and 246C included in the first cell block 240. The plurality of second local word lines LWL<0:63> correspond to the plurality of memory cells 254A, 254B, 254C, 255A, 255B, 255C, 256A, 256B, and 256C included in the second cell block 250.

The plurality of global word lines GWL<0:63> are coupled to the plurality of first local word lines LWL1<0:63> through the plurality of first transistors 241 to 243, and coupled to the plurality of second local word lines LWL2<0:63> through the plurality of second transistors 251 to 253.

Since the first cell block 240 is selected, the plurality of transistors 241 to 243 are turned on by the first cell block selection signal BLK<0>. Therefore, a voltage applied to the plurality of global word lines GWL<0:63> is transferred to the plurality of memory cells 244A, 244B, 244C, 245A, 245B, 245C, 246A, 2468, and 246C included in the first cell block 240 through the first local word lines LWL1<0:63>. Since the second cell block 250 is not selected, the plurality of second transistors 251 to 253 are turned off by the second cell block selection signal BLK<1>. Therefore, a voltage applied to the plurality of global word lines GWL<0:63> is not transferred to the second local word lines LWL2<0:63>.

The back bias driver 220 applies a ground voltage GND to the bulk region of the plurality of transistors 241 to 243 and 251 to 253, but applies the second negative voltage VNEG2 when a negative voltage operation signal NEG_S is applied. Since the plurality of transistors 241 to 243 and 251 to 253 share the bulk region, the same voltage is applied to the bulk region of the plurality of transistors 241 to 243 and 251 to 253, regardless of whether a cell block is selected or not.

The plurality of negative voltages VNEG1 to VNEG3 refer to negative voltages which are generated to drive the respective units of the nonvolatile memory device. The voltage levels of the negative voltages VNEG1 to VNGE3 may be equal to each other or may be different from each other. However, the third negative voltage VNEG3 may be smaller than a value obtained by adding the first negative voltage and the threshold voltages of the plurality of transistors 241 to 243 and 251 to 253, and the second negative voltage VNEG2 may be smaller than the first negative voltage VNEG1. The reason will be described below. In the following descriptions, the plurality of transistors 241 to 243 and 251 to 253 are assumed to be NMOS transistors.

The first negative voltage VNEG1 is a voltage applied to the first global word line GWL<0>, the second negative voltage VNEG2 is a voltage applied to the bulk region of the second transistor 251, and the third negative voltage VNEG3 is a voltage applied to a gate of the second transistor 251. In the NMOS transistor, a drain and a source form a symmetrical structure. Therefore, a relatively high voltage is applied to the drain, and a relatively low voltage is applied to the source.

When the first negative voltage VNEG1 is used to perform a verification operation, the first global word line GWL<0> is coupled to a source of the second transistor 251, and the first second local word line LWL2<0> is coupled to a drain of the second transistor 251. However, since the second cell block 250 is an unselected block, the second transistor 251 is turned off.

In order to turn off an NMOS transistor, a gate-source voltage is to be smaller than a threshold voltage. Therefore, the third negative voltage VNEG3 may be smaller than a voltage obtained by adding the first negative voltage VNEG1 and the threshold voltage of the second transistor 251. Furthermore, when the second negative voltage VNEG2 is larger than the first negative voltage VNEG1, it may correspond to a case in which a forward voltage is applied to a PN diode of a transistor (for example, second transistor 251), and thus a leakage current may occur. Therefore, the second negative voltage VNEG2 may be equal to or smaller than the first negative voltage.

Figure 3:
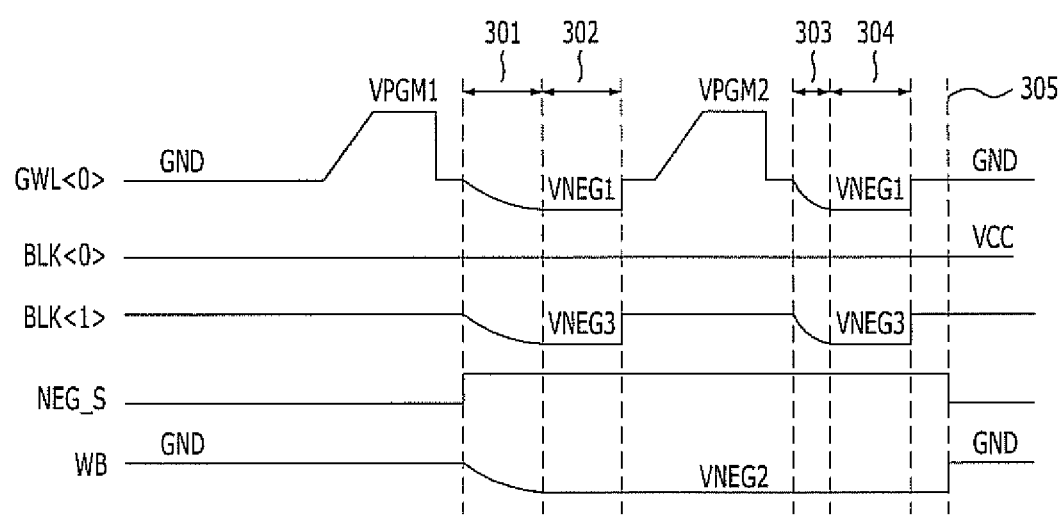
FIG. 3 is a waveform diagram illustrating the operation of the nonvolatile memory device in accordance with the embodiment of the present invention.

FIG. 3 is a waveform diagram illustrating the operation of the nonvolatile memory device in accordance with the embodiment of the present invention.

FIG. 3 shows the waveforms of voltages which are applied to the respective units of the nonvolatile memory device to program a first memory cell 244 of the first cell block 240 into the first program state 122.

In FIG. 3, 'GWL<0>' represents the waveform of a voltage applied to the first global word line GWL<0>, 'BLK<0>' represents the waveform of the first cell block selection signal BLK<0>, 'BLK<1>' represents the waveform of the second cell block selection signal, 'NEG_S' represents the waveform of the negative operation signal NEG_S, and 'WB' represents the waveform of a voltage applied to a well bias line WB.

The first global word line GWL<0> receives a program voltage for programming the first memory cell 244 of the first cell block 240 into the first program state 122.

The program voltage may be applied according to the ISPP scheme. In the ISPP scheme, a first program voltage VPGM1 which is relatively low is applied to a word line, and a verification operation is performed by using the first negative voltage VNGE1. When it is verified that a memory cell has not been programmed, a second program voltage VPGM2 higher than the first program voltage VPGM1 is applied, and the verification operation using the first negative voltage VNEG1 is repeated. The foregoing steps of increasing the program voltage and subsequent verification are performed repeatedly by increasing the program voltage at each subsequent program voltage application step by a step voltage until it is verified that the memory cell has been programmed at the verification voltage VNEG1 or more. In FIG. 3, it is assumed that the program of the first memory cell 244 is completed after two program and verification operations, and the waveform of the voltage applied to the first global word line GWL<0> is shown.

The plurality of first transistors 241 to 243 may transfer a voltage applied to the plurality of global word lines GWL<0:63> to the plurality of first local word lines LWL1<0:63>. Therefore, the first cell block selection signal BLK<0> has a constant turn-on voltage level to turn on the plurality of first transistors 241 to 243. For example, a power supply voltage VCC may be applied as the constant turn-on voltage.

The plurality of second transistors 251 to 253 included in the second cell block 250 may not transfer the voltage applied to the plurality of global word lines GWL<0:63> to the plurality of second local word line LWL2<0:63>. Therefore, the second cell block selection signal BLK<1> has a voltage level to turn off the plurality of second transistors 251 to 253.

Therefore, the gate-source voltage of the second transistors 251 to 253 may be smaller than the threshold voltage. At this time, a section in which a negative voltage is applied to the first global word line GWL<0> coupled to the second transistor 251 is referred to as negative voltage sections 301 to 304.

As described above with reference to FIG. 2, a portion of the second transistor 251 coupled to the first global word line GWL<0> becomes a source, and a portion of the second transistor 251 coupled to the first local word line LWL1<0> becomes a drain. During the negative voltage sections 302 and 304 in which a stable negative voltage is applied, the first negative voltage VNEG1 is applied to the source of the second transistor 251, the second negative voltage VNEG2 is applied to the bulk region, and the third negative voltage VNEG3 is applied to the gate of the second transistor 251. Therefore, the second transistor 251 maintains a turn-off state.

In order to apply a stable negative voltage, the stabilization sections 301 and 302 are used. Even during the stabilization sections 301 and 302, the gate-source voltage of the second transistor 251 is smaller than the threshold voltage. Therefore, the second transistor 251 maintains a turn-off state.

Here, the voltage level of the second cell block selection signal BLK<1> may be set to the third negative voltage VNEG3 before the first negative voltage VNEG1 is applied to the first global word line GWL<0>, and maintained until the program and verification operation is completed.

Furthermore, during the negative voltage sections 302 and 304 in which a stable negative voltage is applied, the second negative voltage VNGE2 may be applied to the bulk region of the second transistor 251. The reason has been described above with reference to FIG. 2.

When the negative voltage operation signal NEG_S is deactivated, the back bias driver 220 applies the ground voltage GND to the bulk region of the plurality of transistors 241 to 243 and 251 to 253 through the well bias line WB. When the negative voltage operation signal NEG_S is activated, the back bias driver 220 applies the second negative voltage VNEG2 to the bulk region of the transistors 241 to 243 and 251 to 253.

In the nonvolatile memory device of FIG. 2, a time point at which the first negative voltage VNGE1 is applied to the first global word line GWL<0> is identical to a time point at which the second negative voltage VNEG2 is applied to the bulk region of the plurality of transistors 241 to 243 and 251 to 253. At this time, due to a parasitic capacitor existing in the NMOS transistor, it takes time until the first and second negative voltages VNEG1 and VNEG2 are stably applied. Such a time is referred to as a settling time. At this time, since the plurality of transistors 241 to 243 and 251 to 253 share the bulk region, a parasitic capacitor of the bulk region has a large value. Therefore, when the time point at which the first negative voltage VNEG1 is applied is identical to the time point at which the second negative voltage VNEG2 is applied to the bulk region of the plurality of transistors 241 to 243 and 251 to 253, the settling time is increased due to the parasitic capacitor of the bulk region. The first section 301 of FIG. 3 indicates that the settling time is increased due to the parasitic capacitor of the bulk region. However, once the voltage of the bulk region of the transistors 241 to 243 and 251 to 253 is stabilized at the second negative voltage VNEG2, the settling time is relatively shorter when the first negative voltage VNGE1 is again applied to the first global word line GWL<0>. This is indicated by the third section 303. When the first section 301 is increased, the time for the program and verification operation is increased.

The reason why the voltage level of the bulk region of the plurality of transistors 241 to 243 and 251 to 253 is not maintained at the second negative voltage VNEG2 at a time point 305 after the program and verification operation is completed may be described as follows. When a memory cell is programmed into the second or third program state 123 or 124, the first and second program voltages VPGM1 and VPGM2 used for such a program is higher than when the memory cell is programmed into the first program state 122. At this time, when a difference between the voltage applied to the bulk region of the transistors 241 to 243 and 251 to 253 and the first and second program voltages VPGM1 and VPGM2 is too large, the device may be damaged.

Therefore, when the operation of programming the memory cell into the first program state 122 is completed, the voltage applied to the bulk region of the plurality of transistors 241 to 243 and 251 to 253 may be changed from the second negative voltage VNEG2 into the ground voltage GND through discharge and thus prevent the device from being damaged even when high program voltages VPGM1 and VPGM2 are applied. In FIG. 3, when the negative voltage operation signal NEG_S is deactivated at the time point 305 after the program and verification operation is completed, the ground voltage GND is applied to the bulk region of the transistors 241 to 243 and 251 to 253 through the well bias line WB by the back bias driver 230, in response to the negative voltage operation signal NEG_S.

That is, when the first negative voltage VNEG1 is applied to the first global word line GWL<0>, the voltage level of the second cell block selection signal BLK<1> may become the third negative voltage VNEG3 to turn off the second transistor 251. For this operation, the second negative voltage VNEG2 may be applied to the bulk region of the second transistor 251. In this case, since the plurality of transistors 241 to 243 and 251 to 253 share the bulk region, it takes a relatively long time for the bulk region to be stabilized at the second negative voltage VNEG2. Therefore, when the time point at which the first negative voltage VNGE1 is applied to the first global word line GWL<0> is identical to the time point at which the second negative voltage VNEG2 is applied to the bulk region of the plurality of transistors 241 to 243 and 251 to 253, the first stabilization section 301 is increased, so that the time for performing the program and verification operation of the nonvolatile semiconductor memory device is increased.

Figure 4:
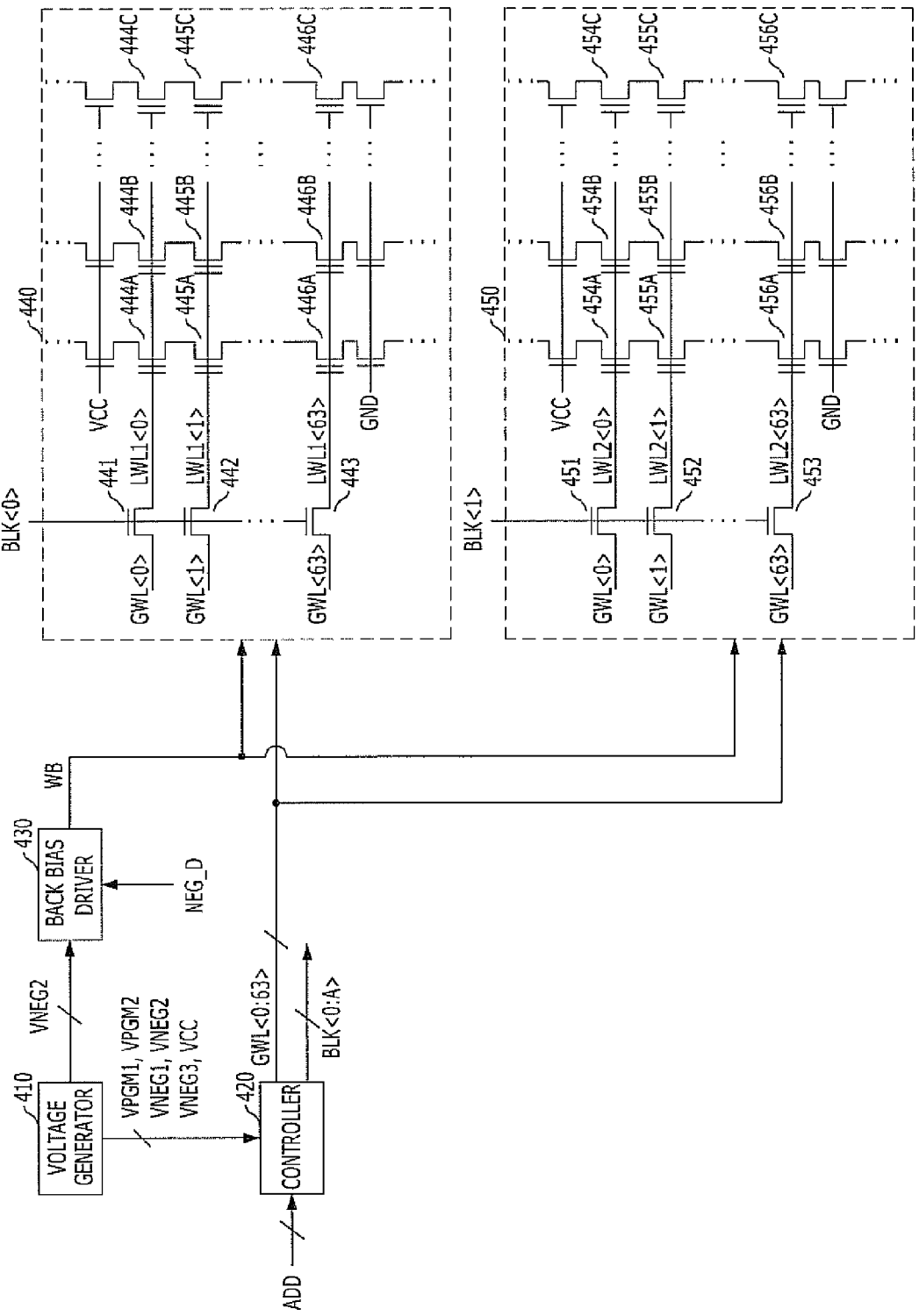
FIG. 4 is a configuration diagram of a nonvolatile memory device in accordance with another embodiment of the present invention.

FIG. 4 is a configuration diagram of a nonvolatile memory device in accordance with another embodiment of the present invention.

Referring to FIG. 4, the nonvolatile memory device in accordance with the embodiment of the present invention includes a plurality of global word lines GWL<0:63>, a plurality of first local word lines LWL1<0:63>, a plurality of second local word lines LWL2<0:63>, a plurality of first transistors 441 to 443, and a plurality of second transistors 451 to 453. The plurality of first local word lines LWL1<0:63> correspond to a plurality of memory cells 444A, 444B, 444C, 445A, 445B, 445C, 446A, 446B, and 446C included in a first cell block 440. The plurality of second local word lines LWL2<0:63> correspond to a plurality of memory cells 454A, 454B, 454C, 455A, 455B, 455C, 456A, 456B, and 456C included in a second cell block 450. The plurality of first transistors 441 to 443 are configured to be turned on to transfer voltages of the global word lines GWL<0:63> to the first local word lines LWL1<0:63>, when the first cell block 450 is selected. The plurality of second transistors 451 to 453 are configured to be turned on to transfer voltages of the global word lines GWL<0:63> to the second local word lines LWL2<0:63>, when the second cell block 450 is selected. Before a first negative voltage VNEG1 is applied to one or more lines among the plurality of global word lines GWL<0:

63>, a bulk region of the first and second transistors 441 to 443 and 451 to 453 are charged with the second negative voltage VNEG2.

Furthermore, the nonvolatile memory device in accordance with the embodiment of the present invention includes a voltage generator 410, a controller 420, and a back bias driver 430. The voltage generator 410 is configured to generate various voltages VPGM1, VPGM2, VNEG1, VNEG2, VNEG3, and VCC for controlling the cell blocks 440 and 450. The controller 420 is configured to drive the plurality of global word lines GWL<0:63> to various voltages VPGM1, VPGM2, VNEG1, VNEG2, VNEG3, and VCC in response to an address signal ADD. The back bias driver 430 is configured to apply a back bias voltage to the bulk region of the first and second transistors 441 to 443 and 451 to 453. Here, voltage generator 410, controller 420, and back bias driver 430 operate as a voltage control unit for supplying control voltages to memory cell blocks.

The various voltages VPGM1, VPGM2, VNEG1, VNEG2, VNEG3, and VCC include a plurality of program voltages VPGM1 and VPGM2, a plurality of negative voltages VNEG1, VNEG2, and VNEG3, and a power supply voltage VCC.

The program voltages VPGM1 and VPGM2 refer to a voltage which is applied to a floating gate of a memory cell to change the threshold voltage of the memory cell during a program operation.

According to an example, the third negative voltage VNEG3 is smaller than a value obtained by adding the first negative voltage VNEG1 and the threshold voltages of the plurality of transistors 441 to 443 and 451 to 453, and the second negative voltage VNEG2 is equal to or smaller than the first negative voltage VNEG1, where such relationships between the voltages produce results discussed with reference to FIG. 2.

According to another example, the first to third negative voltages VNEG1 to VNEG3 may be equal to one another. In this case, the voltage generator 410 generates only the first negative voltage VNEG1.

In the following descriptions, it is assumed that each of the cell blocks 440 and 450 includes 64 memory cells according to an example. The configuration in which two cell blocks 440 and 450 are provided is only an example, and the number of cell blocks may differ depending on embodiments. Furthermore, it is assumed that the first cell block 440 is selected to program an eleventh memory cell 444A of the first cell block 440 into a first program state 122 and the second cell block 450 is not selected.

The controller 420 drives the plurality of global word lines GWL<0:63> to the various voltages VPGM1, VPGM2, VNEG1, VNEG2, VNEG3, and VCC generated by the voltage generator 410, in response to an address ADD and generates a plurality of cell block selection signals BLK<0:A>. Hereafter, A is assumed to be 1. The first cell block selection signal BLK<0> corresponds to the first cell block 240, and the second cell block selection signal BLK<1> corresponds to the second cell block 250.

The global word line GWL<0> corresponding to the memory cell 444A to be programmed is driven to the first program voltage VPGM1, the second program voltage VPGM2, the first negative voltage VNEG1, or a ground voltage GND by the controller 420, in response to the address signal ADD. The address signal ADD may decide to which voltage the global word line GWL<0> is to be driven.

The first negative voltage VNEG1 is a verification voltage for verifying whether the eleventh memory cell 444A of the first cell block 440 has been programmed into the first program state 122 or not. The other ones of the global word lines GWL<1:63> receive a constant turn-on voltage to turn on memory cells. In a NAND nonvolatile memory device, memory cells other than a memory cell to be programmed is turned on.

In the above-described embodiment, since the eleventh memory cell 444A is programmed, a voltage for a program and verification operation is applied to the first global word line GWL<0>, and a voltage for turning on a memory cell is applied to the other global word lines GWL<1:63>.

The descriptions of the first local word lines LWL1<0:63> and the second local word lines LWL2<0:63> are the same as described with reference to FIG. 2.

The back bias driver 430 applies the second negative voltage VNEG2 to the bulk region of the first and second transistors 441 to 443 and 451 to 453 when a negative voltage operation signal VNEG_D is activated and applies a ground voltage to the bulk region of the first and second transistors 441 to 443 and 451 to 453 when the negative voltage operation signal VNEG_D is deactivated.

The operation of the nonvolatile memory device in accordance with the embodiment of the present invention will be described with reference to FIG. 5.

Figure 5:
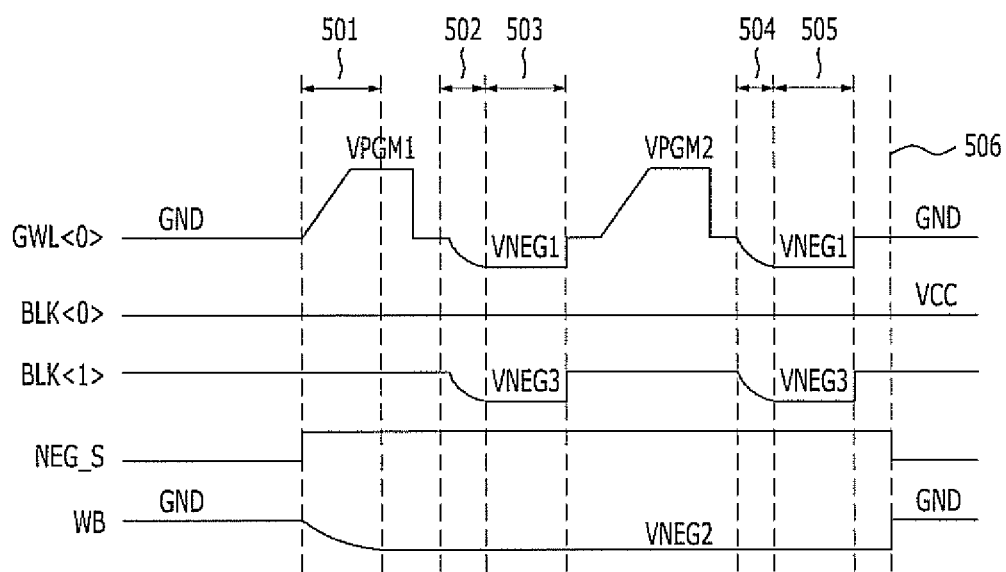
FIG. 5 is a waveform diagram of the nonvolatile memory device in accordance with the embodiment of the present invention.

FIG. 5 is a waveform diagram of the nonvolatile memory device in accordance with the embodiment of the present invention.

In FIG. 5, 'GWL<0>' represents the waveform of a voltage applied to the first global word line GWL<0>, 'BLK<0>' represents the waveform of the first cell block selection signal BLK<0>, 'BLK<1>' represents the waveform of the second cell block selection signal, 'NEG_D' represents the waveform of the negative operation signal NEG_D, and 'WB' represents the waveform of a voltage applied to a well bias line WB.

A program voltage for programming the first memory cell 444 of the first cell block 440 into the first program state 122 is applied to the first global word line GWL<0>.

The program voltage is applied according to the ISPP scheme. The ISPP scheme has been already described above with reference to FIG. 3.

In FIG. 5, it is assumed that the first memory cell 444 of the first cell block 440 is completely programmed after two program and verification operations, and the waveform of the voltage applied to the first global word line GWL<0> is shown.

Since the first cell block 440 is selected, the first transistors 441 to 443 of the first cell block 440 are turned on by the first cell block selection signal BLK<0>. The first cell block selection signal BLK<0> has a constant turn-on voltage level to turn on the plurality of first transistors 441 to 443. For example, the power supply voltage VCC may be applied as the constant turn-on voltage.

Since the second cell block 450 is not selected, the plurality of second transistors 451 to 453 are turned off. Therefore, the second cell block selection signal BLK<1> has a voltage level to turn off the plurality of second transistors 451 to 453. When the first negative voltage VNEG1 is applied to one or more lines among the plurality of global word lines GWL<0:63>, the second cell block section signal BLK<1> becomes the third negative voltage VNEG3. At this time, the plurality of second transistors 451 to 453 has a gate-source voltage lower than a threshold voltage.

Here, a section in which the negative voltage is applied to the first global word line GWL<0> coupled to the second transistor 451 is referred as negative voltage sections 502 to 505.

As described above with reference to FIG. 2, during the sections 503 and 505 in which a stable negative voltage is applied, a portion of the second transistor 451 coupled to the first global word lines GWL<0> becomes a source, and a portion of the second transistor 451 coupled to the first local word line LWL1<0> becomes a drain. During the negative sections 502 and 504, the first negative voltage VNEG1 is applied to the source of the second transistor 451, the second negative voltage VNEG2 is applied to the bulk region, and the third negative voltage VNEG3 is applied to the bulk region. According to the condition among the plurality of negative voltages VNEG1 to VNEG3, which has been described with reference to FIG. 2, the second transistor 451 maintains a turn-off state. In order to apply a negative voltage, the stabilization sections 501 and 502 are used. Even during these sections, the gate-source voltage of the second transistor 451 is smaller than the threshold voltage thereof. Therefore, the second transistor 451 maintains a turn-off state.

However, the voltage level of the second cell block selection signal BLK<1> may be set to the second negative voltage VNEG2 before the first negative voltage VNEG1 is applied to the first global word line GWL<0> and maintained until the program and verification operation is completed.

Furthermore, during the negative voltage sections 502 and 504 in which a stable negative voltage is applied, the second negative voltage VNEG2 is applied to the bulk region of the second transistor 451. The reason has been described above with reference to FIG. 2.

When the negative voltage operation signal NEG_D is deactivated, the back bias driver 420 applies the ground voltage GND to the bulk region of the plurality of transistors 441 to 443 and 451 to 453 through the well bias line WB. When the negative voltage operation signal NEG_D is activated, the back bias driver 420 applies the second negative voltage VNEG2 to the bulk region of the plurality of transistors 441 to 443 and 451 to 453.

Different from the nonvolatile memory device of FIG. 2, the nonvolatile memory device in accordance with the embodiment of the present invention applies the second negative voltage VNGE2 to the bulk region of the plurality of transistors 441 to 443 and 451 to 453, before the first negative voltage VNEG1 is applied to the first global word line GWL<0>. That is, the bulk region of the plurality of transistors 441 to 443 and 451 to 453 is previously charged with the second negative voltage VNEG2.

The first section 501 indicates a time taken to stabilizing the bulk region voltage in response to the application of the second negative voltage VNEG2 as the well bias line WB to the bulk region of the plurality of transistors 441 to 443 and 451 to 453. That is, the bulk region of the plurality of transistors 441 to 443 and 451 to 453, which requires a relatively long time for stabilization, is previously stabilized into the second negative voltage VNEG2. Then, a time taken from the initial application of the first negative voltage VNEG1 to the first global word line GWL<0> to stabilization of the voltage level of the source of the second transistor 451 in response to an application of the first negative voltage VNEG1 as the source voltage may be reduced.

The second negative voltage VNEG2 applied to the bulk region of the plurality of transistors 441 to 443 and 451 to 453 is discharged after the memory cell 444 is completely programmed. In this case, as described above, the voltage level of the bulk region of the plurality of transistors 441 to 443 and 451 to 453 may be maintained at the second negative voltage VNEG2 to reduce a settling time. When the second negative voltage VNEG2 is discharged after the program of the memory cell 444 is completed, the device may be protected as described above with reference to FIG. 3.

That is, the semiconductor memory device in accordance with the embodiment of the present invention charges the bulk region of the plurality of transistors 441 to 443 and 451 to 453 with the second negative voltage VNEG2 before the first negative voltage VNEG1 is applied to the first global word line GWL<0>. Therefore, the speed of the program and verification operation may be increased.

In accordance with the embodiments of the present invention, a time for performing a program and verification operation using negative voltages is reduced in the nonvolatile memory device in which program voltages have a negative voltage distribution. Therefore, the performance of the nonvolatile memory device may be improved.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a plurality of global word lines;
a plurality of first local word lines corresponding to a plurality of memory cells included in a first cell block;
a plurality of second local word lines corresponding to a plurality of memory cells included in a second cell block;
a plurality of first transistors configured to be turned on to transfer voltages of the global word lines to the first local word lines when the first cell block is selected among the first and second cell blocks;
a plurality of second transistors configured to be turned on to transfer the voltages of the global word lines to the second local word lines when the second cell block is selected among the first and second cell blocks; and
a voltage control unit configured to charge a bulk region of the plurality of transistors with a second negative voltage before a first negative voltage is applied to a global word line of the plurality of global word lines,
wherein the voltage control unit is configured to, when the first negative voltage is applied to the global word line of the plurality of global word lines, apply a third negative voltage to gates of the first or second transistors of the unselected one of the first and second cell blocks, respectively, and turn off the transistors applied with the third negative voltage.

2. The nonvolatile memory device of claim 1, wherein the voltage control unit is configured to discharge the second negative voltage charged in the bulk region of the first and second transistors after the memory cells are completely programmed.

3. The nonvolatile memory device of claim 1, wherein the first negative voltage applied to the global word line of the plurality of global word lines comprises a verification voltage for verifying whether a memory cell of a cell block selected between the first and second cell blocks is programmed or not.

4. The nonvolatile memory device of claim 1, wherein the voltage control unit is configured to apply a turn-on voltage to a respective one of the first or second transistors in the selected one of the first and second cell blocks, respectively.

5. The nonvolatile memory device of claim 1, wherein the third negative voltage is smaller than a value obtained by adding the first negative voltage and threshold voltages of the plurality of transistors and the second negative voltage is smaller than or equal to the first negative voltage.

6. The nonvolatile memory device of claim 5, wherein the first to third negative voltages are equal to one another.

7. The nonvolatile memory device of claim 1, wherein the voltage control unit includes:
- a voltage generator configured to generate control voltages for controlling the cell blocks;
- a controller configured to drive the plurality of global word lines with the voltages to be transferred to the first or second local word lines in response to an address signal; and
- a back bias driver configured to apply a back bias voltage to the bulk region of the first and second transistors.

8. The nonvolatile memory device of claim 7, the back bias driver is configured to apply the second negative voltage to the bulk region of the first and second transistors when a negative voltage operation signal is activated and apply a ground voltage to the bulk region of the first and second transistors when the negative voltage operation signal is deactivated.

9. The nonvolatile memory device of claim 7, wherein the control voltages comprise a plurality of program voltages, a plurality of negative voltages, and a power supply voltage.

* * * * *

UNITED STATES PATENT AND TRADEMARK OFFICE
CERTIFICATE OF CORRECTION

PATENT NO. : 8,559,227 B2  Page 1 of 1
APPLICATION NO. : 13/178175
DATED : October 15, 2013
INVENTOR(S) : Lee-Hyun Kwon et al.

It is certified that error appears in the above-identified patent and that said Letters Patent is hereby corrected as shown below:

Title Page, Item (75) Inventors should read:

--(75) Inventors:  Lee-Hyun Kwon, Gyeonggi-do (KR);
In-Soo Wang, Gyeonggi-do (KR);
Myung-Jin Park, Gyeonggi-do (KR)--.

Signed and Sealed this
Twenty-sixth Day of November, 2013

Margaret A. Focarino
*Commissioner for Patents of the United States Patent and Trademark Office*